United States Patent [19]

Hayashi et al.

[11] Patent Number: 5,365,078
[45] Date of Patent: Nov. 15, 1994

[54] SEMICONDUCTOR DEVICE AND METHOD OF MAKING IT

[75] Inventors: Kazuo Hayashi; Takuji Sonoda, both of Itami, Japan

[73] Assignee: Mitsubishi Denki Kabushiki Kaisha, Tokyo, Japan

[21] Appl. No.: 130,885

[22] Filed: Oct. 4, 1993

[30] Foreign Application Priority Data

Oct. 6, 1992 [JP] Japan ................... 4-267006

[51] Int. Cl.$^5$ ........................... H01L 29/78
[52] U.S. Cl. ................... 257/24; 257/284; 257/286; 257/653; 257/773
[58] Field of Search ............. 257/24, 284, 286, 653, 257/773

[56] References Cited

U.S. PATENT DOCUMENTS 5,198,879 3/1993 Ohshima ..................... 257/24

OTHER PUBLICATIONS

Sovero et al, "Noise Figure Characteristics of $\frac{1}{2}\mu m$ Gate Single-Heterojunction High-Electron-Mobility FET's at 35 GHz", IEEE Electron Device Letters, vol. EDL-7, No. 3, Mar. 1986, pp. 179-181.

*Primary Examiner*—Edward Wojciechowicz
*Attorney, Agent, or Firm*—Leydig, Voit & Mayer

[57] ABSTRACT

A semiconductor device includes a semiconductor substrate and channel and electron supply layers epitaxially grown on the semiconductor substrate. Source, drain, and gate electrodes are disposed on the electron supply layer. At least the gate electrode and the electron supply layer are structured such that an electron gas within the channel layer is one-dimensional to prevent scattering of electrons in the channel layer.

5 Claims, 8 Drawing Sheets

F I G. I  Prior Art

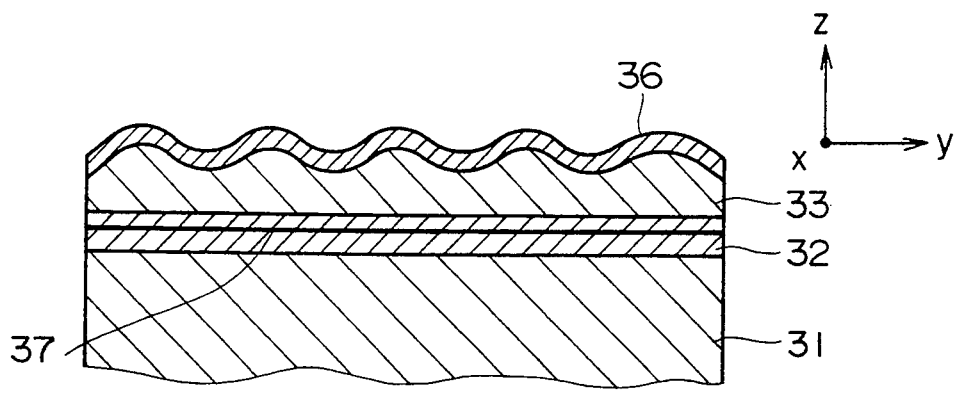
F I G. 4 (a)
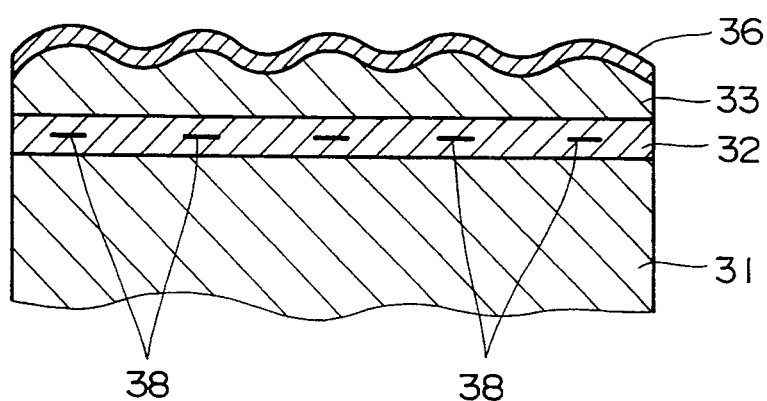
F I G. 4 (b)

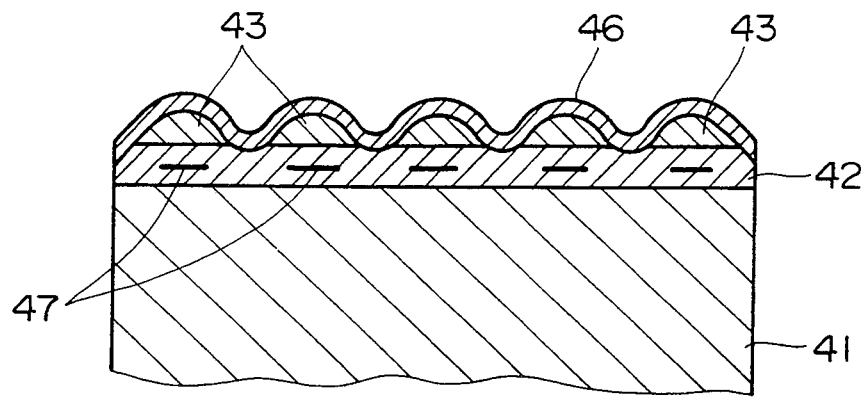
F I G. 5
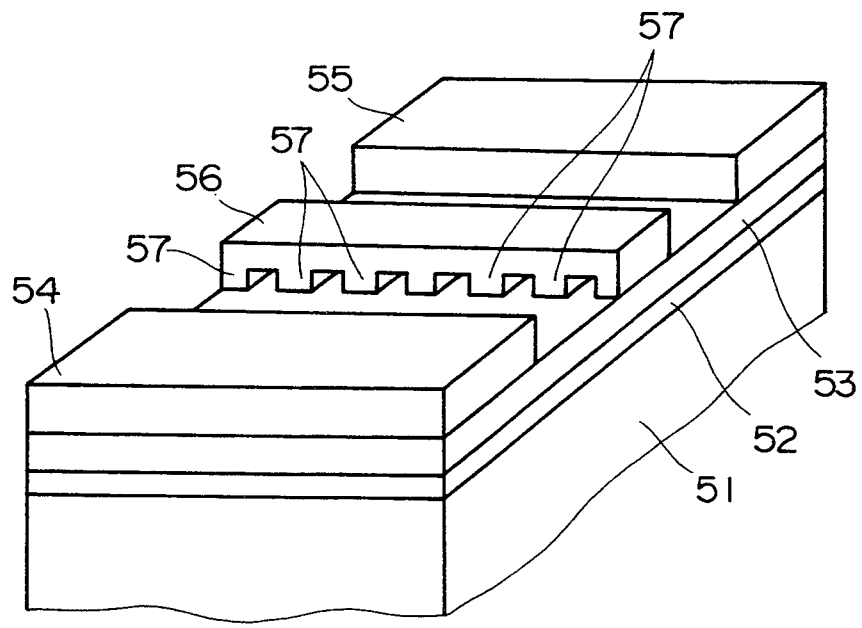
F I G. 6

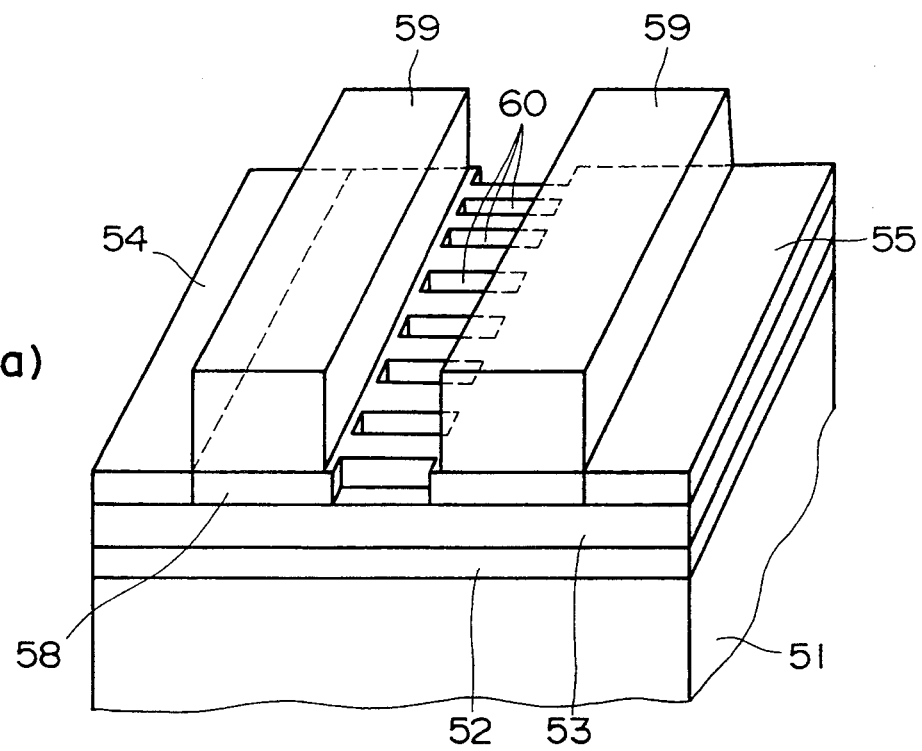
F I G. 10 (a)
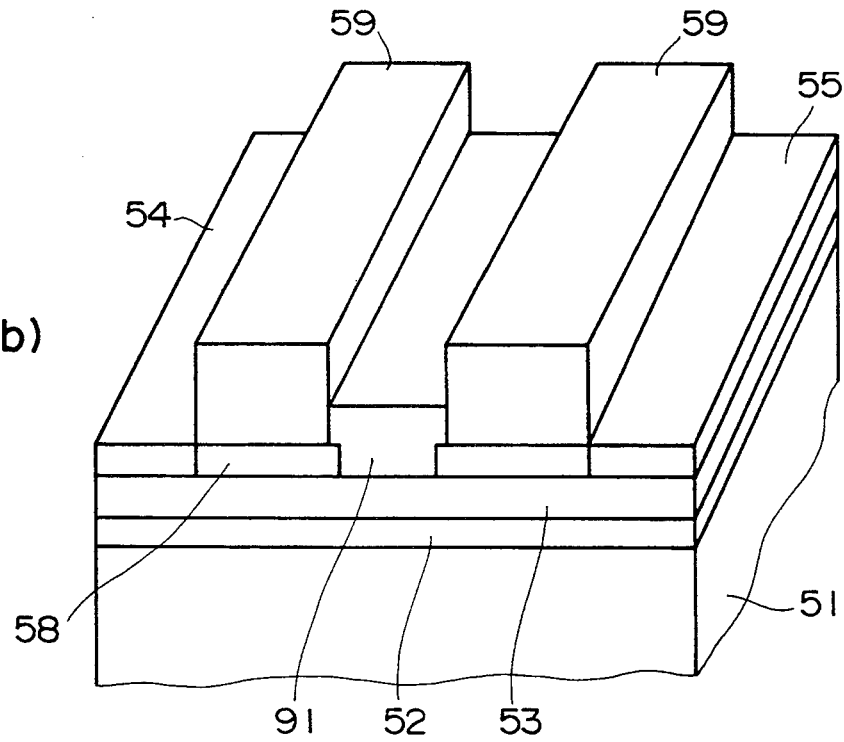
F I G. 10 (b)

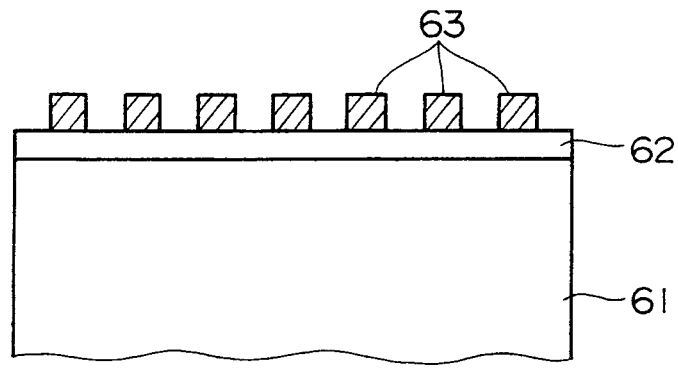
F I G. 11(a)
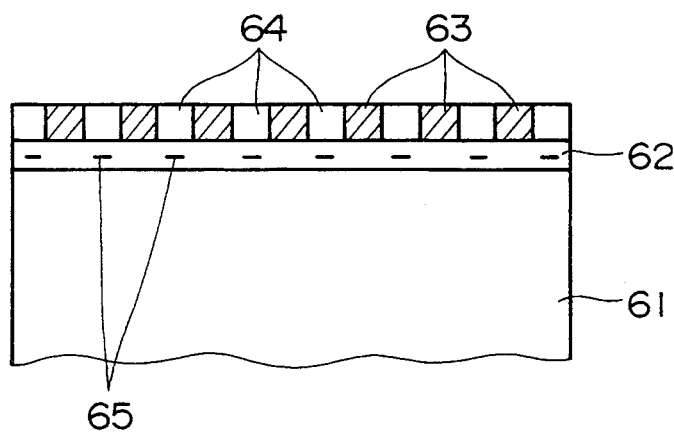
F I G. 11(b)
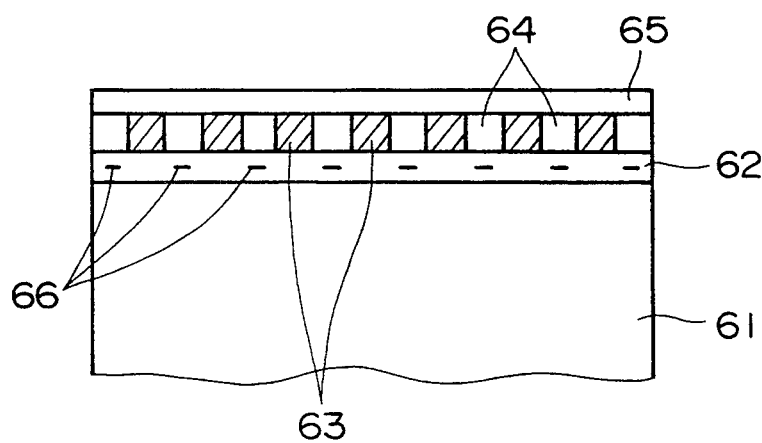
F I G. 11(c)

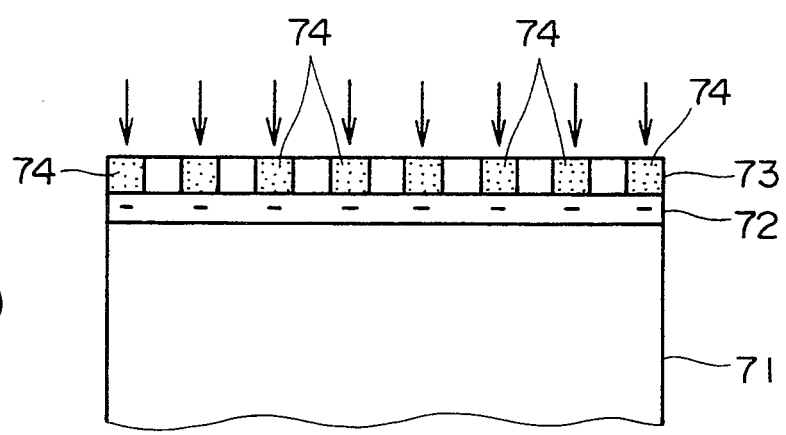
F I G. 12(a)
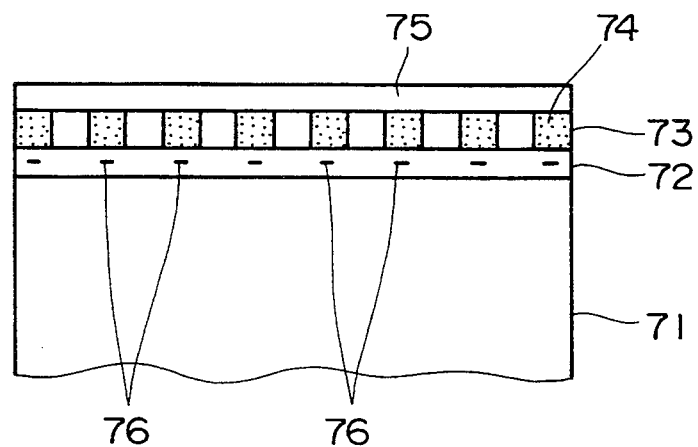
F I G. 12(b)

SEMICONDUCTOR DEVICE AND METHOD OF MAKING IT

The present invention relates to a semiconductor device and, more particularly, to a field effect transistor (FET) operable as an extremely high speed switching device and also operable as an extremely low noise transistor. The present invention also relates to a method of making such a transistor.

BACKGROUND OF THE INVENTION

A conventional two-dimensional electron gas FET is schematically shown in FIG. 1. On a semiconductor substrate 1, an undoped channel layer 2 of, for example, GaAs or InGaAs and an n-type doped electron supply layer 3 of, for example, InAlAs, AlGaAs, or GaAs are stacked. On electron supply layer 3, a source electrode 4, a drain electrode 5, and a gate electrode 6 are disposed.

As known well, electron supply layer 3 is made of a material having a smaller electron affinity than the material of channel layer 2. Thus, in this FET, carriers generated by donors, with which electron supply layer 3 is doped, move into undoped channel layer 2 so that a two-dimensional electron gas layer (2-DEG) 7 which, in view of quantum mechanics, has lost its freedom in the z-direction Is formed in channel layer 2. Because the two-dimensional electron gas (2-DEG) moves in channel layer 2 which has not been doped with an impurity, little impurity dispersion occurs and, therefore, the electron mobility is large. This means that this FET can operate at a high speed.

Although scattering in the z-direction can be suppressed when the electron gas moves from a source region in channel layer 2 beneath source electrode 4 toward a drain region in channel layer 2 beneath drain electrode 5, it is subjected to scattering in the y-direction or scattering including y-direction components as indicated by broken line arrows, in FIG. 1. This poses limitations on increasing the operating speed and on suppressing noise.

As described above, the conventional semiconductor device shown in FIG. 1 has a defect that because the electron gas is subjected to scattering including y-direction components, further improvement of high-speed and low-noise operation cannot be made. An object of the present invention is to provide a semiconductor device in which the degree of freedom not only in the z-direction but also in the y-direction is removed to make the electron gas in a channel layer one-dimensional so that the semiconductor device can operate at a higher speed and with less noise.

SUMMARY OF THE INVENTION

According to a first aspect of the present invention, a semiconductor layer includes a channel layer and an electron supply layer stacked on a semiconductor substrate; a gate electrode, a source electrode, and a drain electrode; a source region in the channel layer beneath the source electrode, and a drain region in the channel layer beneath the drain electrode; and a plurality of parallel corrugations repeating at a predetermined pitch in a surface of the electron supply layer immediately beneath the gate electrode extending in the same direction as a channel between the source and drain regions. A bias voltage applied to the gate electrode disposed on the corrugated surface of the electron supply layer makes the electron gas within the channel layer immediately beneath the gate electrode one-dimensional.

According to a second aspect of the present invention, a semiconductor device includes a channel layer and an electron supply layer stacked on a semiconductor substrate. Parallel corrugations of the same height repeating at a predetermined pitch are present in the entire surface of the electron supply layer. Each corrugation extends in the same direction as a channel between a source region and a drain region which are in the channel layer beneath a source electrode and a drain electrode, respectively, the electrodes being disposed on the corrugated surface of the electron supply layer. The corrugations repeat in a direction perpendicular to the direction of the channel. A gate electrode is also disposed on the corrugated surface of the electron supply layer. The electron gas within the channel layer is one-dimensional over the entire area between the source and drain regions.

According to a third aspect of the present invention, parallel corrugations are arranged with a predetermined pitch in a surface of an electron supply layer on a semiconductor substrate. The corrugations extend in the direction of a channel between a source region and a drain drain region in the channel layer beneath a source electrode and a drain electrode of the device, respectively, and the height of the corrugations in the portion of the electron supply layer beneath a gate electrode of the device is different from the height in the remaining portions. The electron gas in the channel layer between the source region and the gate electrode and in the channel layer between the gate electrode and the drain region is always one-dimensional, whereas the electron gas in the channel layer beneath the gate electrode is made one-dimensional in response to a bias voltage applied to the gate electrode.

According to a fourth aspect of the present invention, a semiconductor device includes a first series of parallel corrugations in a surface region of an electron supply layer on a semiconductor substrate immediately beneath a gate electrode. The corrugations extend in the same direction as a channel between source and drain regions in the channel layer beneath source and drain electrodes, respectively, and repeat with a predetermined pitch in a direction perpendicular to the direction of the channel. The device further includes a second series of parallel corrugations in the remaining portion of the surface of the electron supply layer. The second series of corrugations extend in the direction of the channel and repeat 180° out-of-phase with the first series corrugations. The electron gas is always one-dimensional within the channel layer between the source region and the portion of the channel layer beneath the gate electrode and between the channel layer beneath gate electrode and the drain region. When the electron gas within the channel layer portion immediately beneath the gate electrode is made one-dimensional in response to a bias voltage applied to the gate electrode, the source-drain path is nonconductive. The source-drain path is conductive only when the electron gas within the channel layer portion immediately beneath the gate electrode is made two-dimensional in response to a bias voltage applied to the gate electrode.

According to a fifth aspect of the present invention, a semiconductor device includes a channel layer and an electron supply layer stacked on a semiconductor substrate, a gate electrode with an air-bridge structure having a number of equally spaced parallel legs is disposed on a flat surface of the electron supply layer between source and drain electrodes of the device. Each of the gate electrode legs extends in the same direction as a channel in the channel layer between source and drain regions in the channel layer beneath the source and drain electrodes respectively. In response to a bias voltage applied to the gate electrode, an electron gas within the channel layer portion immediately beneath the gate electrode is one-dimensional.

Further, according to a sixth aspect of the present invention, a method of making a semiconductor device comprises epitaxially growing a channel layer or a channel layer and a part of an electron supply layer on a semiconductor substrate, forming on the epitaxially grown layers, a plurality of equally spaced, parallel dielectric coatings extending in the same direction as a channel in the channel layer between source and drain regions in the channel layer beneath source and drain electrodes, respectively, epitaxially growing an electron supply layer between adjacent dielectric coatings, and disposing on the electron supply layer, a source electrode, a drain electrode, and a gate electrode.

According to a seventh aspect of the invention, a method of making a semiconductor device comprises successively disposing a channel layer and an undoped layer on a semiconductor substrate, and implanting a donor dopant into the epitaxially grown layers in regions which are spaced from each other with a predetermined pitch and extend in the direction as the direction of a channel in the channel layer between source and drain regions in the channel layer to form within the epitaxially grown layers fine-line active regions for making an electron gas within the channel layer one-dimensional.

According to an eighth aspect of the present invention, a method of making a semiconductor device comprises successively growing a channel layer and an electron supply layer in a stack on a semiconductor substrate, forming a first resist layer on the electron supply layer, the first resist layer having openings therein extending in the same direction as a channel in the channel layer between source and drain regions and being mutually spaced by a predetermined distance, forming a second resist layer over the first resist layer with the openings and their peripheries being exposed through the second resist layer, vapor depositing a metal within the openings and the exposed first resist layer portions, and lifting off the respective resist layers to leave an air-bridge structure gate electrode having a number of equally spaced legs disposed on the electron supply layer.

In each of the semiconductor devices according to the first through fifth aspects of the invention, the electron gas within the channel layer is one-dimensional so that the semiconductor device can operate at a much higher speed with reduced noise which could be caused by electron gas scattering. The sixth through eighth aspects of the invention provide a simple method of making a semiconductor device in which the electron gas within the channel layer is one-dimensional.

BRIEF DESCRIPTION OF THE DRAWINGS

FIGS. 4(a) and 4(b) are cross-sections through a gate electrode of a semiconductor device according to the present invention for explaining the operation of the semiconductor devices according to the first and second embodiments of FIGS. 2 and 3, first and third modifications of the second embodiment, and a third embodiment shown in FIG. 6, in which FIG. 4(a) illustrates the state of the electron gas (2DEG) when a gate bias voltage Vg is below a certain value, and FIG. 4(b) illustrates the state of the electron gas (1DEG) when the gate bias voltage Vg is above a certain value.

FIG. 5 shows a cross-section through a gate electrode for explaining the operation of a second modification of the second embodiment of the present invention.

FIG. 6 is a perspective view of a semiconductor device according to the third embodiment of the present invention.

FIG. 10(a) and 10(b) are perspective views of a semiconductor device useful for explaining a method of making a semiconductor device according to the third embodiment of the present invention, in which FIG. 10(a) shows the device in a stage in which a resist has been formed in a predetermined pattern on an electron supply layer, and FIG. 10(b) shows the device in a stage in which a metal for a gate electrode has been vapor deposited on the resist layer.

FIG. 11(a)–11(c)illustrate a first example of a method of making a fine-line structure for making an electron gas one-dimensional in a semiconductor device of the present invention, in which FIG. 11(a) is a cross-sectional view of the device in a stage in which a dielectric layer is disposed on a channel layer, FIG. 11(b) is a cross-sectional view of the device in a stage in which an electron supply layer has a fine-line structure by virtue of the presence of the dielectric layer, and FIG. 11c) is a cross-sectional view of the device in which a gate electrode is disposed on the structure shown in FIG. 11().

FIGS. 12(a) and 12(b) illustrates how to form a fine-line structure of a semiconductor device of the present invention for making an electron gas one-dimensional, in which FIG. 12(a) is a cross-sectional view of the device in a stage in which an active layer has been formed by selective donor implantation in an undoped layer 73, and FIG. 12(b) is a cross-sectional view of the device in a stage including a gate electrode.

DETAILED DESCRIPTION OF THE INVENTION

Now, the present invention is described in detail with reference to the accompanying drawings.

Figure 1:
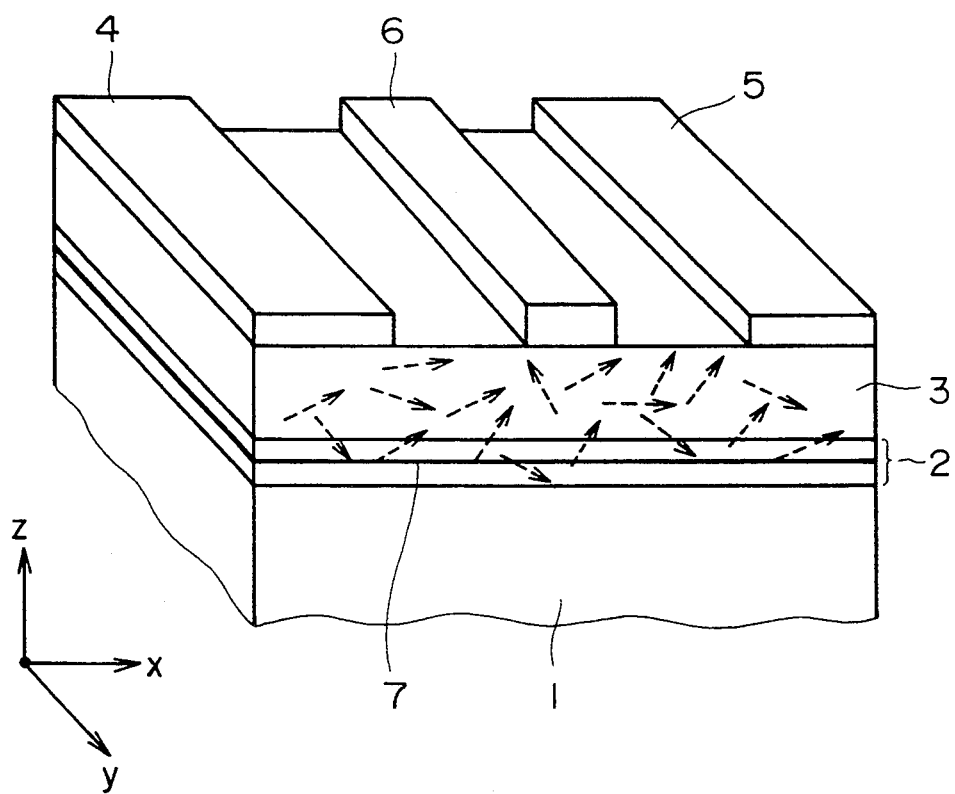
FIG. 1 is a perspective view of a conventional semiconductor device in which an electron gas within a channel layer is a two-dimensional electron gas.
Figure 2:
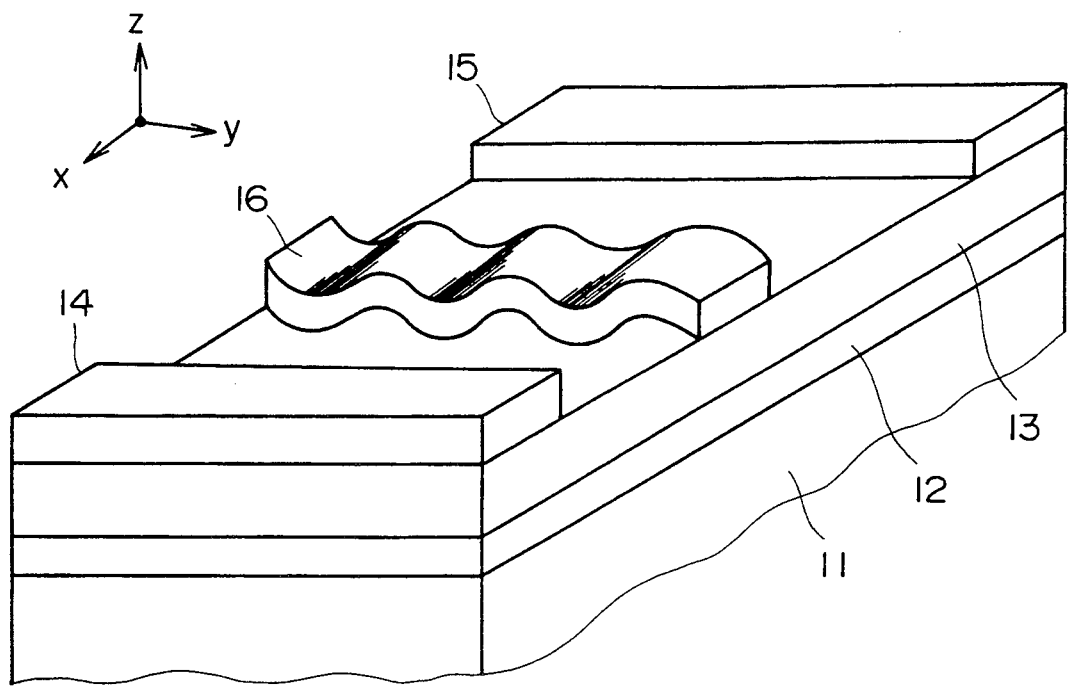
FIG. 2 is a perspective view of a semiconductor device according to a first embodiment of the present invention.

FIG. 2 is a perspective view of a semiconductor device according to a first embodiment of the present invention. The device includes a semiconductor substrate 11 of, for example, GaAs or InP. An undoped channel layer 12 of, for example, GaAs or InGaAs, and an n-type doped electron supply layer 13 of InAlAs, AlGaAs or GaAs are disposed in a stack by, for example, epitaxial growth. A source electrode 14 and a drain electrode 15 are disposed on electron supply layer 13. According to the first embodiment of the present invention, corrugations are formed with a predetermined pitch in the portion of the surface of electron supply layer 13 where a gate electrode 16 is to be disposed. Each of the peaks and valleys of the corrugations extends in the direction of a channel between a source and a drain of the device. Gate electrode 16 is disposed on the corrugated surface of electron supply layer 13.

Figure 3:
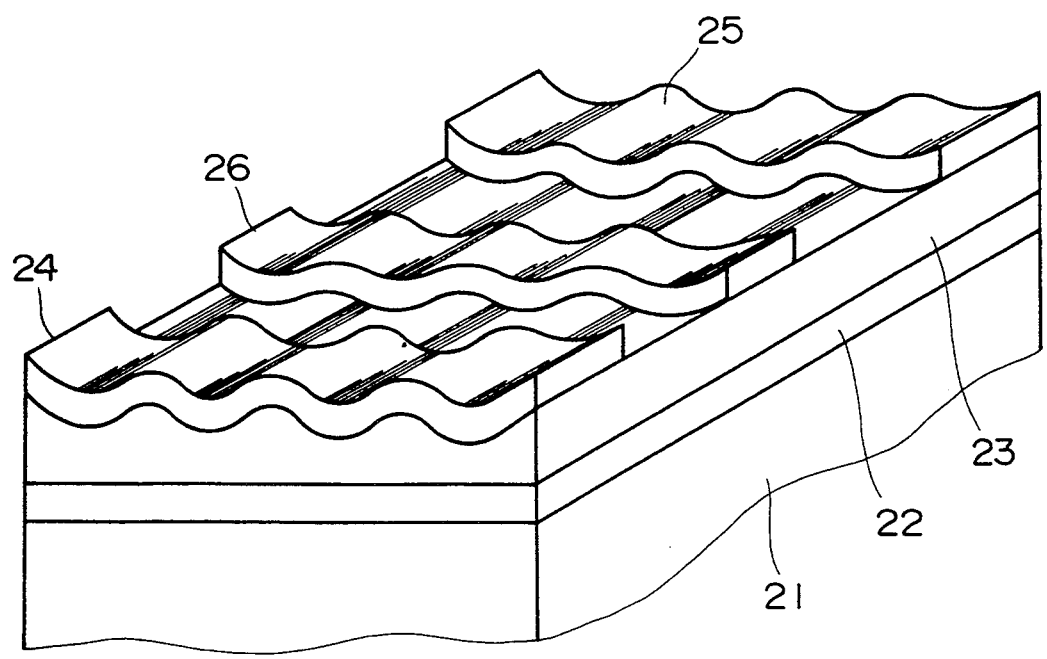
FIG. 3 is a perspective view of a semiconductor device according to a second embodiment of the present invention.

FIG. 3 shows a semiconductor device according to a second embodiment of the present invention. Similar to the device shown in FIG. 2, on a semiconductor substrate 21 of, for example, GaAs or InP, an undoped channel layer 22 of, for example, GaAs or InGaAs and an n-type doped electron supply layer 23 of, for example, InAlAs, AlGaAs, GaAs or the like are disposed in stack by, for example, epitaxy. According to this second embodiment, the entire surface of electron supply layer 23 is corrugated at a predetermined pitch. The peaks and valleys of the corrugations extend in the direction of the channel. A source electrode 24, a drain electrode 25, and a gate electrode 26 are disposed on the corrugated surface of electron supply layer 13.

FIGS. 4(a), 4(b), and 5 show cross-sections through the gate electrode of the respective devices of FIGS. 2 and 3.

In FIGS. 4(a) and 4(b), 31 denotes a semiconductor substrate, 32 denotes an undoped channel layer, 33 denotes an electron supply layer, and 36 denotes a gate electrode. In FIGS. 4(a) and 4(b), electron supply layer 33 has a sufficient thickness so that when a gate bias voltage $V_g$ applied to gate electrode 36 forms a shallow electron gas layer, electron gas 37 within channel layer 32 that electron gas layer is two-dimensional as shown in FIG. 4(a). That is, the electron gas is mobile not only in the direction x of the channel but also in a direction orthogonal to the channel, i.e. in the y direction. When the gate voltage $V_g$ is larger than a certain magnitude, channel layer 32 has a fine-line structure comprising a plurality of parallel fine line channel portions so that the electron gas beneath the valleys of gate electrode 36 is confined in the direction y to thereby make the electron gas one-dimensional as indicated by a reference numeral 38 as shown in FIG. 4(b). Thus, the electron gas is in the form of fine lines.

FIG. 5 shows an example in which an electron supply layer beneath a gate electrode is very thin or absent. In FIG. 5, 41 denotes a semiconductor substrate, 42 denotes an undoped channel layer, and 43 denotes an electron supply layer which is divided by the valleys in a gate electrode 46 into fine lines. With this structure, an electron gas 47 within channel layer 42 is always one-dimensional.

The device according to the first embodiment shown in FIG. 2 has its electron supply layer 13 beneath gate electrode 16 structured as shown In FIGS. 4(a) and 4(b). As stated above, when the gate bias voltage V, Is less than a certain magnitude, a 2DEG is produced within channel layer 12 as shown in FIG. 4(a), but, when the gate voltage $V_g$, exceeds a certain magnitude, the electron gas is confined not only in the direction z but also in the channel direction z as shown in FIG. 4(b) so that the electron gas within channel layer 12 is shaped into one-dimensional fine lines. Thus, the device can operate at a higher speed with reduced noise. When the device is operated in the 2DEG mode, it is equivalent to a conventional FET and can handle a relatively large current.

In the device according to the second embodiment shown in FIG. 3, corrugations are formed in the entire surface of electron supply layer 23 on the semiconductor substrate. There may be three modifications contemplated depending on the thicknesses of those portions of electron supply layer 23 beneath gate electrode 26, and beneath source and drain electrodes 24 and 25. A first modification produces a structure including corrugations over the entire surface of electron supply layer 23, like the one shown in FIGS. 4(aand 4(b). In this modification, as in the second embodiment, when the bias voltage $V_g$ is below a certain magnitude, the electron gas within channel layer 12 is a 2DEG. as shown in FIG. 4(a), but for the bias voltage $V_g$ above a certain magnitude, electrons are confined in the y direction, too, so that the electron gas within channel layer 12 becomes one-dimensional to thereby achieve high speed, low noise operation. In this modification, uniform corrugations are present over the entire surface of electron supply layer 23. Accordingly, it is easier to fabricate the device of this first modification than the FET shown in FIG. 2.

A second modification to the embodiment shown in FIG. 3 may comprise surface corrugations as shown in FIG. 5 over the entire surface of electron supply layer 43. In this second modification, an electron gas is one-dimensional beneath gate electrode 26 and also in the channel layer between a source region in channel layer 42 beneath source electrode 24 and between the gate electrode 26 and a drain region in channel layer 42 beneath drain electrode 25. Thus, the device can operate at a higher speed with further reduced noise. Furthermore, source and drain parasitic resistances R, and R are reduced, which also increases operating speed and reduces noise.

A third modification to the second embodiment shown in FIG. 3 comprises corrugations like the ones shown in FIG. 4 in the surface portion of electron supply layer 23 where gate electrode 26 is disposed and corrugations like the ones shown in FIG. 5 in the remaining surface portions of electron supply layer 23. In this third modification, as in the case of the first modification, an electron gas within the channel layer can be made one-dimensional depending on the magnitude of a bias voltage $V_g$ applied to gate electrode 26. In addition, between the source region and the gate electrode and between the gate electrode and the drain region, the channel layer is structurally one-dimensional so that parasitic resistances $R_s$ and $R_d$ are small. Thus, as in the respective examples discussed above, the device of this modification can operate at a high speed and with low noise, too.

FIG. 6 is a perspective view of a semiconductor device according to a third embodiment of the present invention. According to the third embodiment, corrugations are not formed in the surface of an electron supply layer on a semiconductor substrate, but the gate electrode has an air-bridge structure which includes a number of equally spaced legs in contact with surface portions of the electron supply layer. Each of the legs extend in the direction of the channel in the channel layer. The semiconductor device shown in FIG. 6 includes a semiconductor substrate 51, a channel layer 52, and an electron supply layer 53. A source electrode 54, a drain electrode 55, and a gate electrode 56 are disposed on the surface of electron supply layer 53. Gate electrode 56 is in the form of air-bridge as shown in FIG. 6, and includes a number of equally spaced parallel legs 57. A gate voltage $V_g$ is applied to electron supply layer 53 only at portions of legs 57 which are in direct contact with the surface of electron supply layer 53.

When the gate voltage $V_g$ is below a certain value, an electron gas within channel layer 52 is two-dimensional as shown in FIG. 4(a), but when the gate voltage $V_g$ is above a certain value, the electron gas is confined in portions of channel layer 52 between adjacent legs 57 of gate electrode 56 so that the electron gas is made one-dimensional, as shown in FIG. 4(b). The operation and effects of the FET shown in FIG. 6 are substantially the same as those of the FET of FIG. 2.

Figure 7:
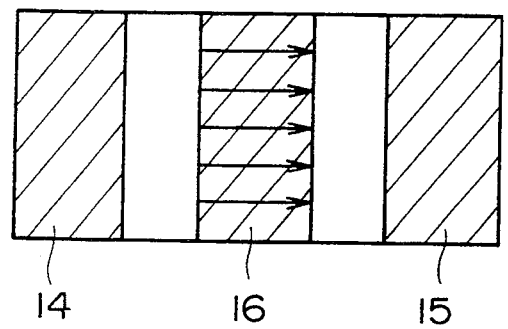
FIG. 7 diagramatically shows a first example of a fine-line structure for making an electron gas one-dimensional in a semiconductor device according to the present invention.

Operation of the respective embodiments may be schematically described as follows by means of plan views. FIG. 7 is for use in explaining the operation of the device shown in FIG. 2, the device according to the first modification of the device shown in FIG. 3, and the device shown in FIG. 6. Source, drain and gate electrodes are denoted respectively by reference numerals 14, 15, and 16. As shown in FIG. 7, in these devices, the electron gas beneath the gate electrode is made one-dimensional.

Figure 8:
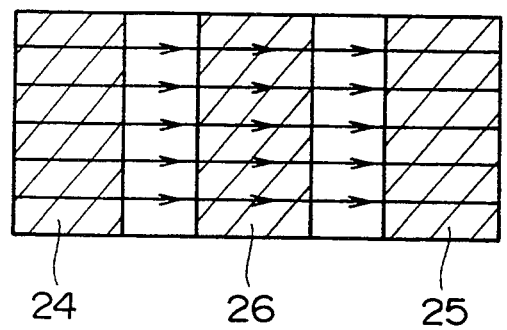
FIG. 8 diagramatically shows a second example of a fine-line structure for making an electron gas one-dimensional in a semiconductor device of the present invention.

FIG. 8 is for explaining the operation of the devices according to the second and third modifications of the device shown in FIG. 3. In such devices, the electron gas present not only in the channel layer beneath gate electrode 26 but also in the entire channel layer between source electrode 24 and drain electrode 25 is one-dimensional.

Figure 9:
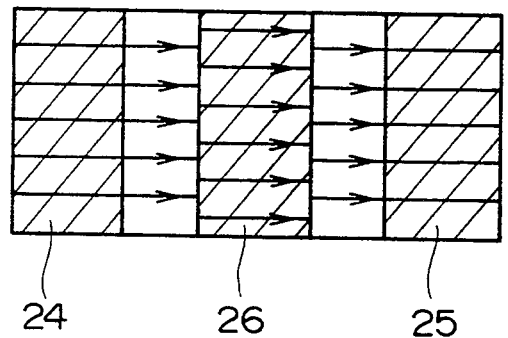
FIG. 9 diagramatically shows a third example of a fine-line structure for making an electron gas one-dimensional in a semiconductor device of the present invention.

FIG. 9 is useful for explaining the operation of the devices according to the second and third modifications of the second embodiment shown in FIG. 3, in which the period of the 1DEG within the channel layer portion beneath gate electrode 26 is 180° out of phase with respect to the period of the 1DEG in the remaining portion. In these examples, with a larger bias voltage $V_g$ applied to gate electrode 26 to make one-dimensional the electron gas within the channel layer portion beneath gate electrode 26 as shown, current does not flow between the source region and the drain region, and only when a smaller bias voltage $V_g$ is applied to form the electron gas within the channel layer portion beneath the gate electrode does current flow between the source region and the drain region. Thus, the device can act as a fast switching element.

FIG. 10(a) and 10(b) show how gate electrode 56 of the semiconductor device according to the third embodiment shown in FIG. 6 may be fabricated. As shown in FIG. 10(a), a channel layer 52 and an electron supply layer 53 are successively grown epitaxially on a semiconductor substrate 51. On the surface of electron supply layer 53 between a source electrode 54 and a drain electrode 55, a lower resist layer 58 and an upper resist layer 59 are formed by a photolithographic technique in order to produce a gate electrode. Lower resist layer 58 may be formed by electron beam exposure (EB exposure) of a resist such as PMGI, while upper resist layer 59 may be optically exposing a resist, such as novolak-type resist. Alternatively, lower and upper resist layers 58 and 59 may be formed of an EB resist such as PMMA having different sensitivities for the respective layers. In any case, the EB pattern for lower resist layer 58 should be set to form fine-line depressions 60 shown in FIG. 10(a) in layer 58. Depressions 60 are for forming legs 57 of gate electrode 56 of FIG. 6.

Next, as shown in FIG. 10(b), a metal 91 is vapor deposited over lower resist layer 59 between upper resist layer portions 59. In fact, metal 91 is deposited over upper resist layer portions 59, too, but it is not shown, because it is not pertinent to the subject of the invention. Resist layers 58 and 59 are lifted off after the vapor deposition of metal 91, which results in an air-bridge-shaped gate electrode 56 with equally spaced legs 57 as shown In FIG. 5.

According to the described method, depressions 60 in lower resist layer 58 are formed by electron beam exposure, depressions 60 in the form of very fine lines can be formed easily by using a focused electron beam, which results in very fine gate electrode legs 57.

FIGS. 11(a)-11(c) illustrates how to produce a fine-line structure in the portion of a channel layer corresponding to the location where a gate electrode is disposed, or in the entire channel layer, for making an electron gas within that portion or the entire channel layer one-dimensional. As shown in FIG. 11(a), after a channel layer 62 is epitaxially grown on a semiconductor substrate 61, dielectric layers 63 are selectively formed on channel layer 62 with such a pitch as to produce a fine-line structure in channel layer 62. Thereafter, as shown in FIG. 11(b), an electron supply layer 64 is epitaxially grown selectively on channel layer 62 at locations between dielectric layers 63. After that, a gate electrode 65 is formed as shown in FIG. 11(c). In this structure, electron supply layer 64 is separated into fine lines by dielectric layers 63, and, therefore, the device operates in a manner similar to the device of FIG. 5, whereby the electron gas supplied from electron supply layer 64 to channel layer 62 is one-dimensional as indicated by lines 66 in FIG. 11(c). In this example, the surface of the device is not irregular, but it is flat, which facilitates the formation of various electrodes including gate electrode 65.

Alternatively, following to the epitaxial growth of channel layer 62 on semiconductor substrate 61, part of the electron supply layer may be epitaxially grown, then, dielectric layers 63 are formed, and after that the remaining portion of the electron supply layer may be epitaxially grown until a flat surface is obtained. The device fabricated in this manner operates in a manner similar to the device shown in FIGS. 4(a and 4(b). In this case, since a flat surface is formed, subsequent formation of electrodes becomes easy.

FIGS. 12(a) and 12(b) illustrates another method for providing a fine-line structure of a channel layer. As shown in FIG. 12(a), a channel layer 72 and an undoped layer 73 are disposed in a stack on a semiconductor substrate 71. A donor, such as Si, is selectively injected into undoped layer 73 to form active regions 74 for providing a fine-line structure for channel layer 72. Next, a gate electrode 75 is formed as shown in FIG. 12(b). In this example, active regions 74 serve as an electron supply layer, and an electron gas is confined within the portions of channel layer 72 beneath active regions 74 or electron supply layer. Thus, 1DEG 76 is produced. In this method, too, the surface of the electron supply layer is flat, which makes it easy to form electrodes thereon.

As described in detail in the above, according to the present invention, an electron gas within a channel layer of a semiconductor device is confined not only in the z direction but also in the y direction so as to become one-dimensional, whereby the electron gas is prevented from being scattered in the y direction perpendicular to the channel direction x. Thus, the semiconductor device can operate at a higher speed and with significantly reduced noise. Accordingly, the device of the present invention is suitably used in a signal processing circuit, a and the like which are required to operate at a high speed with low noise.

According to the present invention, as shown in FIGS. 10(a), 10(b), 11(a)–11(c), 12(a), and 12(b), since a channel layer is epitaxially grown on a flat surface of a semiconductor substrate, good crystallographic characteristics are obtained so that electron mobility is advantageously large. Furthermore, according to the method shown in FIGS. 10(a) and 10(b), lower resist layer 58 is electron-beam patterned so that a gate electrode structure necessary for making an electron gas within a channel layer one-dimensional can be fabricated readily. According to the method shown in FIGS. 11(a–11(c), a mask for use in forming the dielectric layers, the dielectric layers, and electron supply layer 64 are all formed on flat surfaces. Accordingly, electron supply layer 64 for making an electron gas fine-line shaped is easily and precisely prepared. Further, according to the method shown in FIG. 12, fine-line structured electron supply layer 74 can be formed in an undoped layer 73 very easily by focusing an ion beam.

What is claimed is:

1. A semiconductor device comprising:
   a semiconductor substrate;
   a channel layer and an electron supply layer successively stacked on said semiconductor substrate;
   source, drain, and gate electrodes disposed on a surface of said electron supply layer;
   source and drain regions in said channel layer beneath said source and drain electrodes, respectively; and
   parallel corrugations in the surface of said electron supply layer beneath said gate electrode, said corrugations having peaks and valleys extending along a channel in said channel layer between said source and drain regions, said corrugations repeating with a predetermined period whereby an electron gas within said channel layer beneath said gate electrode is one-dimensional when a bias voltage is applied to said gate electrode.

2. A semiconductor device comprising:
   a semiconductor substrate;
   a channel layer and an electron supply layer successively stacked on said semiconductor substrate;
   source, drain, and gate electrodes disposed on a surface of said electron supply layer;
   source and drain regions in said channel layer beneath said source and drain electrodes, respectively; and
   parallel corrugations with equal amplitudes in the entire surface of said electron supply layer, said corrugations having peaks and valleys extending along a channel in said channel layer between said source and drain regions, said corrugations repeating with a predetermined period whereby an electron gas within said channel layer between said source and drain region is one-dimensional.

3. A semiconductor device comprising:
   a semiconductor substrate;
   a channel layer and an electron supply layer successively stacked on said semiconductor substrate;
   source, drain, and gate electrodes disposed on a surface of said electron supply layer;
   source and drain regions in said channel layer beneath said source and drain electrodes, respectively; and
   parallel corrugations in the surface of said electron supply layer, said corrugations having peaks and valleys extending along a channel in said channel layer between said source and drain regions, said corrugations repeating with a predetermined period, said corrugations beneath said gate electrode being different in amplitude from the corrugations in other portions of the surface of said electron supply layer whereby an electron gas within said channel layer between said source region and said gate electrode and between said gate electrode and said drain region are always one-dimensional and an electron gas within said channel layer beneath said gage electrode is one-dimensional when a bias voltage is applied to said gate electrode.

4. A semiconductor device comprising:
   a semiconductor substrate;
   a channel layer and an electron supply layer successively stacked on said semiconductor substrate;
   source, drain, and gate electrodes disposed on a surface of said electron supply layer;
   source and drain regions in said channel layer beneath said source and drain electrodes, respectively;
   a first series of parallel corrugations in the surface of said electron supply layer beneath said gate electrode, said first series of corrugations having peaks and Valleys extending along a channel in said channel layer between said source and drain regions and repeating with a predetermined period; and
   a second series of parallel corrugations in the surface of said electron supply layer, said second series of corrugations repeating with the predetermined period and being phase shifted by 180° from said first series of corrugations whereby an electron gas within said channel layer between said source region and said gate electrode and between said gate electrode and said drain region is always one-dimensional and an electron gas within said channel layer beneath said gate electrode is one-dimensional when a bias voltage is applied to said gate electrode and wherein the channel layer between said source and drain regions is non-conductive when said electron gas within said channel layer beneath said gate electrode is one-dimensional and is conductive only when the electron gas in said channel layer beneath said gate electrode is two-dimensional in response to a bias voltage applied to said gate electrode.

5. A semiconductor device comprising:
   a semiconductor substrate;
   a channel layer and an electron supply layer successively stacked on said semiconductor substrate;
   source, drain, and gate electrodes disposed on a surface of said electron supply layer;
   source and drain regions in said channel layer beneath said source and drain electrodes, respectively, said gate electrode having an air-bridge structure including a plurality of parallel legs contacting the surface of said electron supply layer, said legs being spaced at a predetermined interval and extending transverse to a channel in the channel layer extending between said source and drain regions whereby an electron gas within said channel layer beneath said gate electrode is one-dimensional when a bias voltage is applied to said gate electrode.

* * * * *